US010985578B1

(12) United States Patent
Ardaman et al.

(10) Patent No.: US 10,985,578 B1
(45) Date of Patent: Apr. 20, 2021

(54) TABLET STORAGE AND CHARGING CABINET

(71) Applicants: Andrew Asim Ardaman, Maitland, FL (US); Marc W. Karpel, Northford, CT (US)

(72) Inventors: Andrew Asim Ardaman, Maitland, FL (US); Marc W. Karpel, Northford, CT (US)

(*) Notice: Subject to any disclaimer, the term of this patent is extended or adjusted under 35 U.S.C. 154(b) by 311 days.

(21) Appl. No.: 15/939,533

(22) Filed: Mar. 29, 2018

Related U.S. Application Data

(60) Provisional application No. 62/487,057, filed on Apr. 19, 2017.

(51) Int. Cl.
| | |
|---|---|
| H02J 7/00 | (2006.01) |
| H05K 7/20 | (2006.01) |
| H05K 5/02 | (2006.01) |
| G06K 19/077 | (2006.01) |

(52) U.S. Cl.
CPC .......... *H02J 7/0027* (2013.01); *H02J 7/0044* (2013.01); *H05K 5/0221* (2013.01); *H05K 7/20136* (2013.01); *H05K 7/20909* (2013.01); *G06K 19/077* (2013.01)

(58) Field of Classification Search
CPC .... H02J 7/0027; H02J 7/0044; H05K 5/0221; H05K 7/20136; H05K 7/20909
USPC .......................................... 320/107, 115, 132
See application file for complete search history.

(56) References Cited

U.S. PATENT DOCUMENTS

| | | | | |
|---|---|---|---|---|
| 8,904,198 B1* | 12/2014 | Pinto | ..................... | G07F 15/006 455/572 |
| 2007/0058344 A1* | 3/2007 | Baker | ...................... | H02J 1/10 361/695 |
| 2017/0150304 A1* | 5/2017 | Baldasare | ............. | H04W 12/08 |

* cited by examiner

*Primary Examiner* — Edward Tso
*Assistant Examiner* — Aaron Piggush
(74) *Attorney, Agent, or Firm* — Allen Dyer Doppelt & Gilchrist, PA

(57) ABSTRACT

A tablet charging cabinet includes a storage space having a base, a top wall, two opposed side walls, and a back wall, and a plurality of angled partition panels defining a plurality of storage and charging compartments at different elevations therein, each compartment having a respective connector at the back of the respective panels. Each connector is configured for providing power supply and network connection to a respective electronic device connected thereto. At least two alignment posts located on two sides of each connector to facilitate alignment of an electronic device to a respective connector. Each partition panel is configured to have an opening to allow a charging indicator light of an electronic device to be visible from outside the cabinet. The plurality of partition panels are angled downward toward the back wall to facilitate connection of an electronic device to a respective connector.

15 Claims, 12 Drawing Sheets

TABLET STORAGE AND CHARGING CABINET

CROSS-REFERENCE TO RELATED APPLICATION

The present application claims the benefit of U.S. Provisional Patent Application Ser. No. 62/487,057, filed on Apr. 19, 2017, the contents of which are herein incorporated by reference in their entirety.

FIELD OF THE INVENTION

The present invention relates to a cabinet, and more particularly, to a cabinet for storing and charging tablets and other portable electronic devices.

BACKGROUND OF THE INVENTION

Electronic and multimedia technologies and modern mobile electronic devices, such as notebook computers, tablets, personal data assistants (PDAs) are now widely used in everyday life throughout the world. The batteries of these electronic devices need to be charged periodically so that the devices will be readily usable on demand. Data stored on such devices will also need to be uploaded, downloaded and/or updated periodically.

Current tablet charging cabinets often have wired connectors and power plugs, requiring a user to plug in to matching connectors of the respective electronic device. Locating the right connectors and plugging in takes time. The approach also presents more potential failure points, such as pinched cables, broken connector ends, tangled wires, and the like. Therefore, it is desirable to provide a cabinet that minimizes or eliminates the foresaid problems.

SUMMARY OF THE INVENTION

In view of the foregoing, it is an object of the present invention to provide an improved tablet storage and charging cabinet. According to one embodiment of the present invention, a tablet charging cabinet includes a storage space having a base, a top wall, two opposed side walls, a back wall, and a plurality of angled partition panels defining a plurality of storage and charging compartments at different elevations therein. Each compartment has a respective connector at the back of the respective panels. Each connector is configured for providing power supply and network connection to a respective electronic device connected thereto. Each partition panel is configured to have an opening to allow a charging indicator light of an electronic device to be visible from outside the cabinet. The plurality of partition panels are angled downward toward the back wall to facilitate connection of an electronic device to a respective connector.

According to another embodiment of the present invention, a tablet charging cabinet includes a storage space having a base, a top wall, two opposed side walls, and a back wall and a plurality of angled partition panels defining a plurality of storage and charging compartments at different elevations therein. Each compartment has a respective connector at the back of the respective panels. An alignment mechanism is located in close proximity to the connector to facilitate alignment of an electronic device to a respective connector. Each connector is configured for providing power supply and network connection to a respective electronic device connected thereto. The plurality of partition panels are angled downward toward the back wall to facilitate connection of an electronic device to a respective connector.

According to another embodiment of the present invention, a method of charging one or more electronic devices using a charging cabinet includes unlocking the cabinet door and inserting one or more electronic devices into respective compartment. Each electronic device is pressed toward the back of respective compartment to ensure a secure connection to the respective connectors. The cabinet door is locked and the charging status of the one or more electronic devices are monitored through the cabinet door.

These and other objects, aspects and advantages of the present invention will be better appreciated in view of the drawings and following detailed description of preferred embodiments.

DETAILED DESCRIPTION OF PREFERRED EMBODIMENTS

Figure 1:
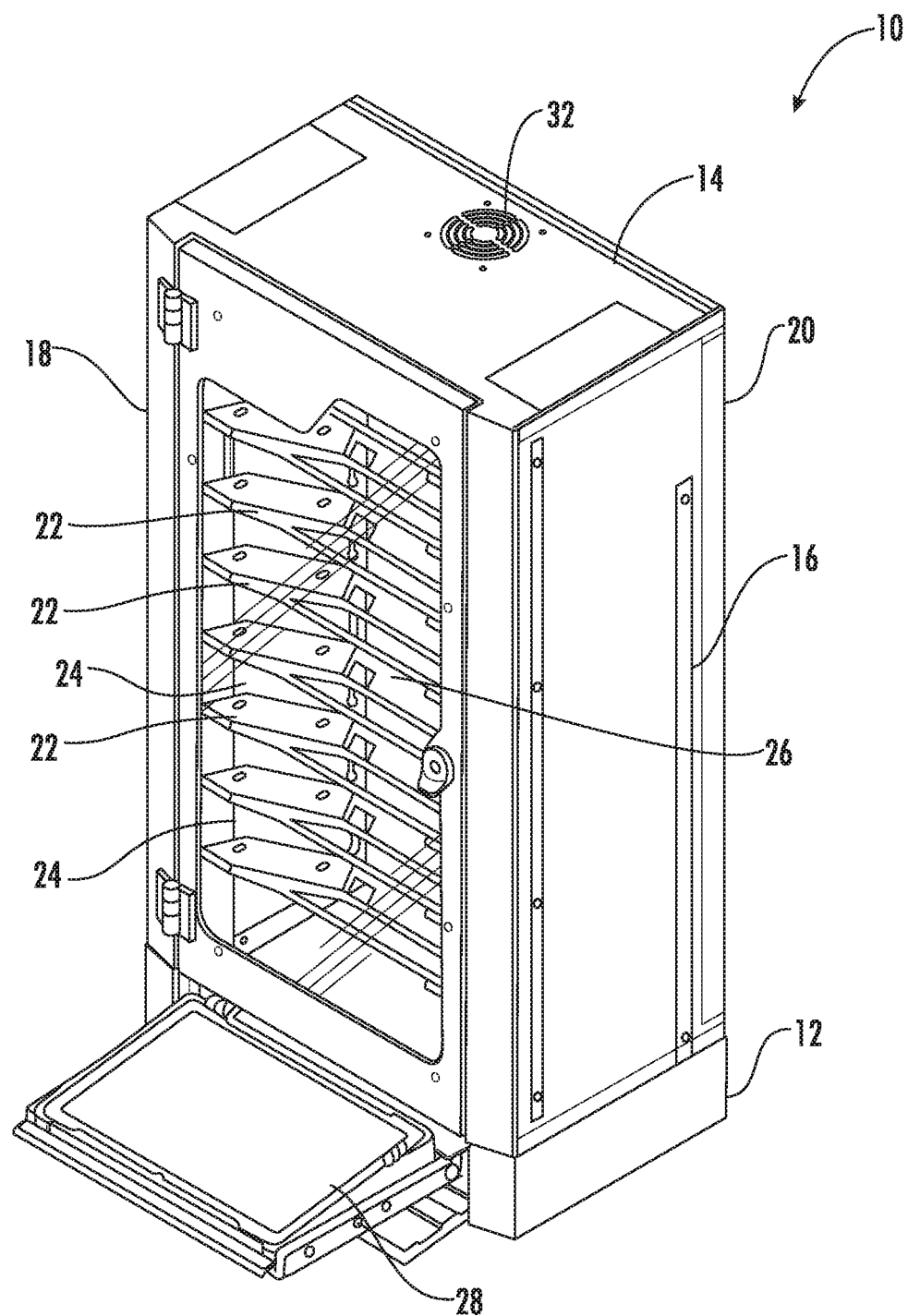
FIG. 1 is a perspective view of a tablet storage and charging cabinet, according to an embodiment of the present invention.
Figure 4:
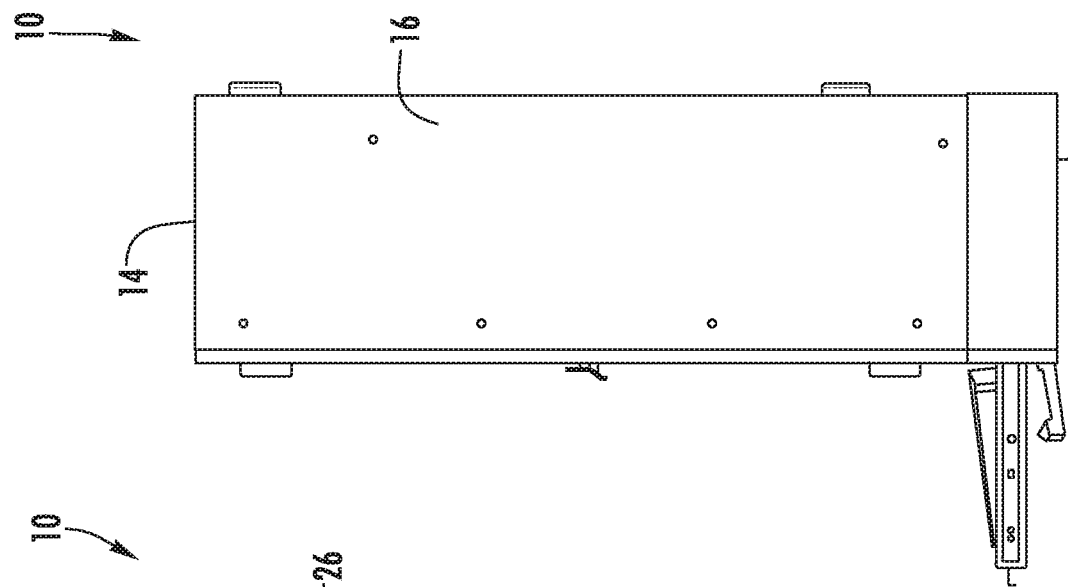
FIG. 4 is another side view of the storage and charging cabinet of FIG. 1.
Figure 2:
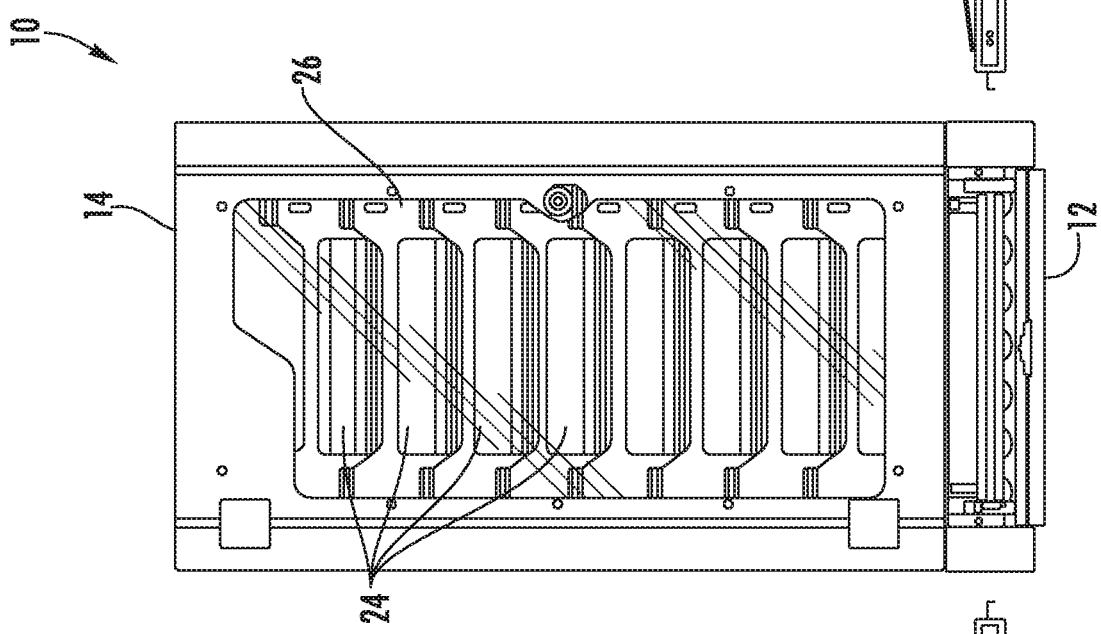
FIG. 2 is a front view of the storage and charging cabinet of FIG. 1.
Figure 3:
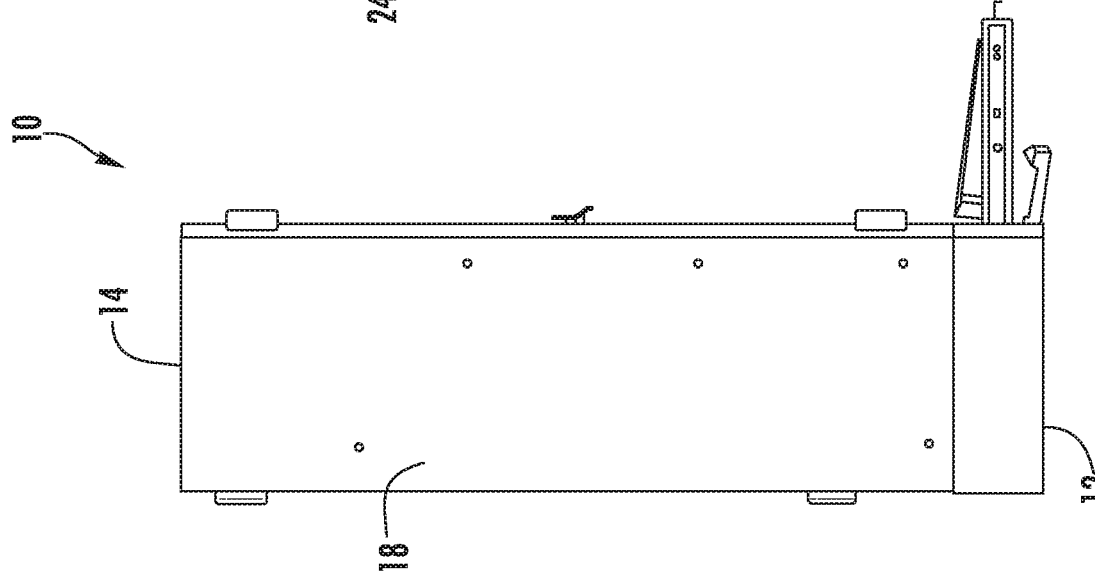
FIG. 3 is a side view of the storage and charging cabinet of FIG. 1.
Figure 5:
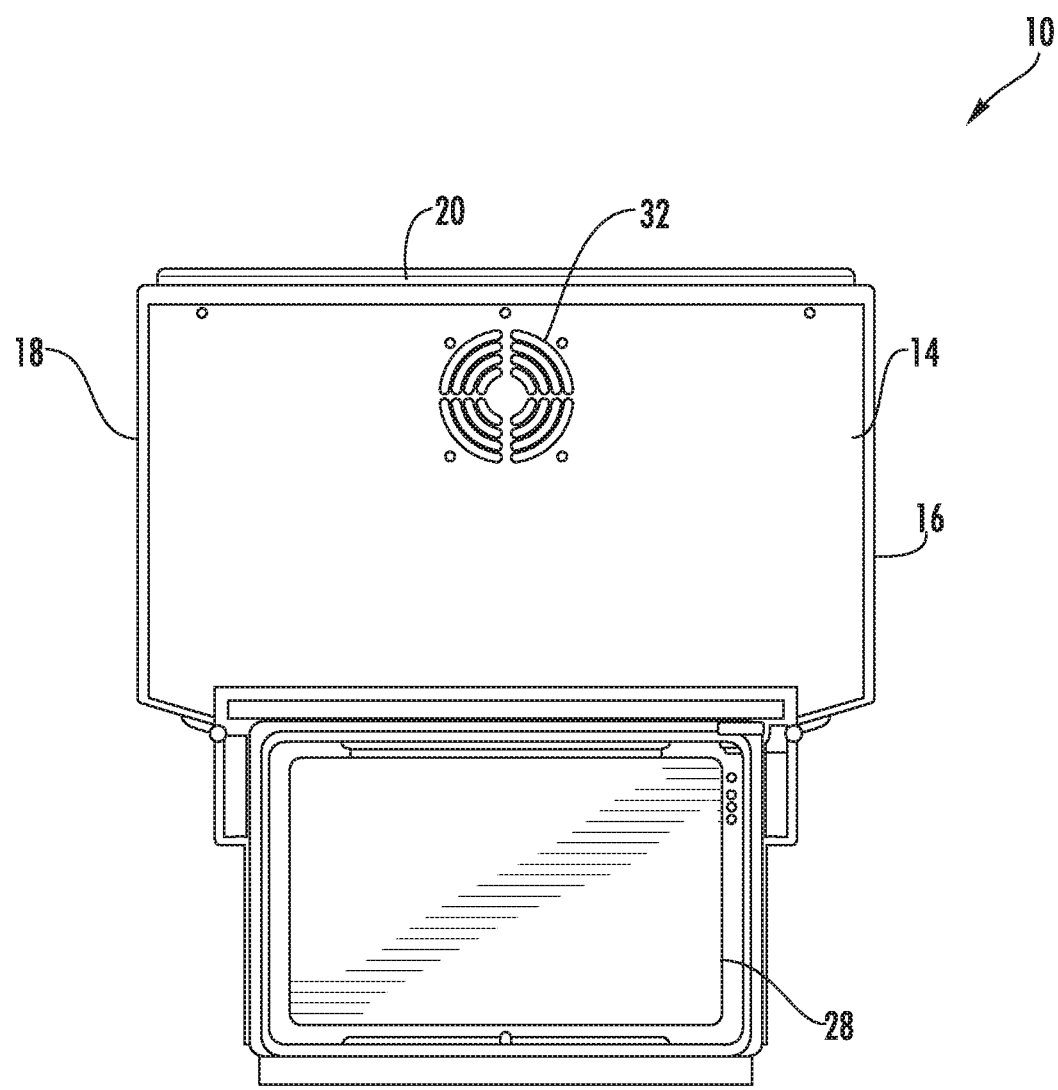
FIG. 5 is a top view of the storage and charging cabinet of FIG. 1.
Figure 6:
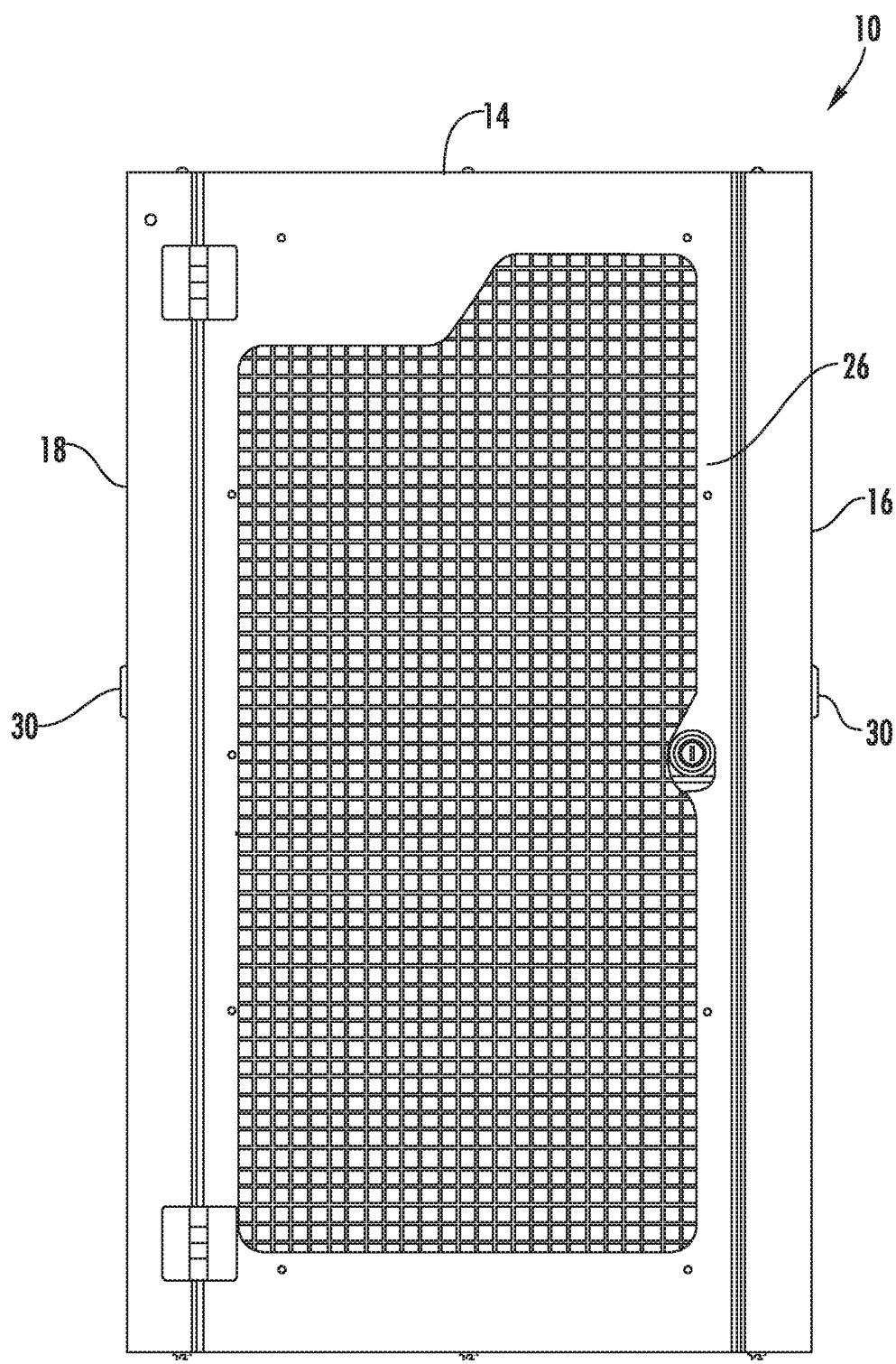
FIG. 6 is a front view of a tablet storage and charging cabinet, according to another embodiment of the present invention.
Figure 7:
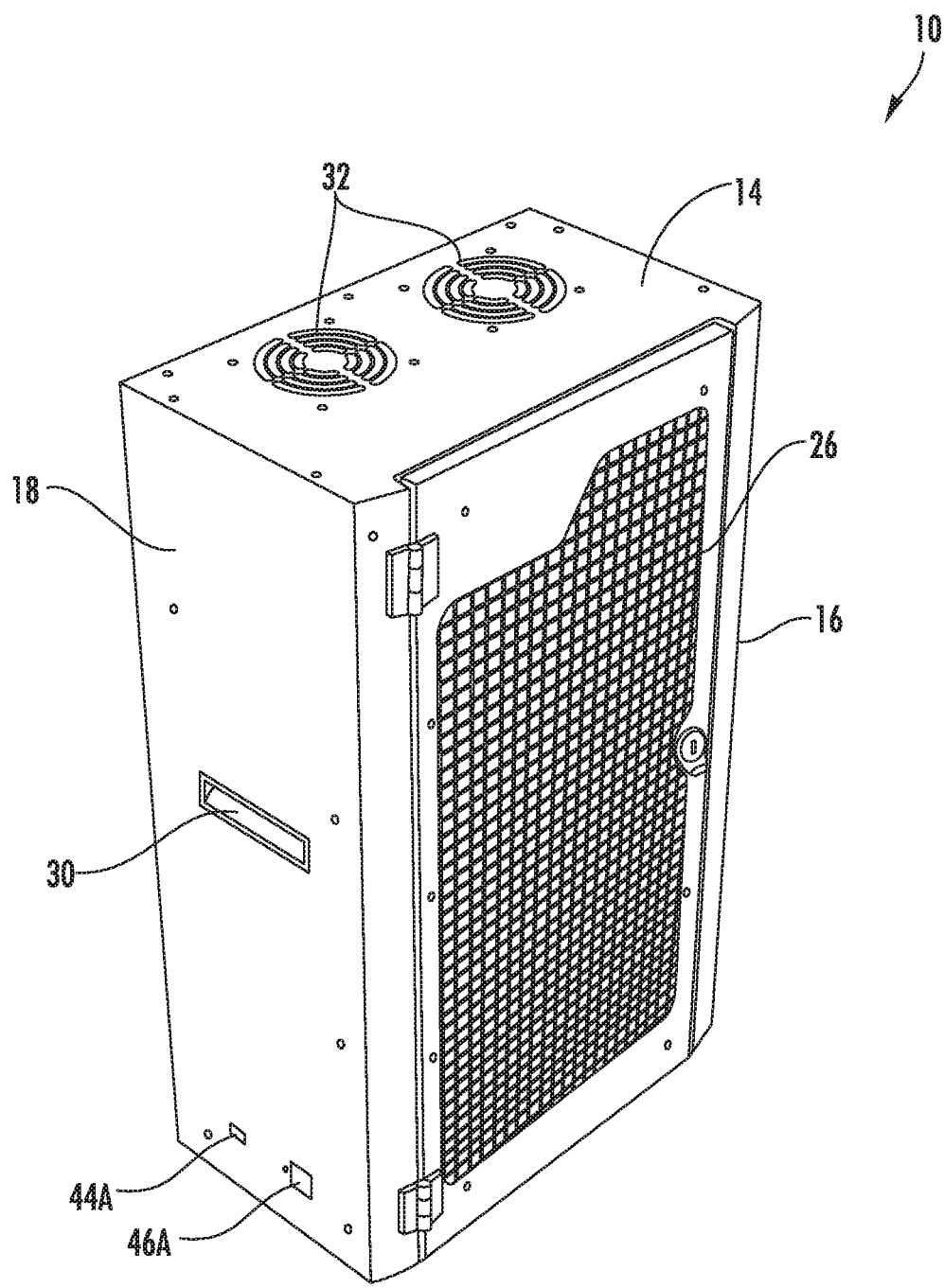
FIG. 7 is a perspective view of a tablet storage and charging cabinet of FIG. 6.

Referring to FIGS. 1-7, a tablet charging cabinet 10 includes a storage space formed of a base 12 and a top 14, two opposed side walls 16 and 18, a back wall 20. A plurality of angled partition panels 22 are positioned inside the storage space to define a plurality of storage and charging compartments 24 at different elevations therein. Each compartment 24 is designed to hold one electronic device such as a tablet or similar type of electronic device. The cabinet 10 advantageously also includes a door 26 that covers the storage space inside the cabinet 10. The door 26 preferably includes at least a section made of a transparent material to allow a power light on an electronic device to be visible to a user when the door 26 is in a closed position, as will be explained in greater detail below. The door 26 can also include at least a section made of mesh material to allow air flow between the charging cabinet and surrounding environment, as shown in FIGS. 6 and 7. The door 26 is preferably lockable to afford secure storage of the electronic devices (e.g., tablet) stored therein. The cabinet 10 can also include an optional pull-out drawer 28 at the bottom of the cabinet 10 to hold a tablet or laptop computer (e.g., featuring administrative and/or other support/tracking features for tablets stored in the cabinet 10) and/or additional storage. The charging cabinet 10 can also include a lift handle 30 on two opposed sidewalls 16 and 18 of the cabinet 10 to facilitate lifting the cabinet 10.

Referring to FIGS. 5 and 7, the cabinet 10 is preferably equipped with at least one fan 32. FIG. 5 shows an exhaust fan 32 positioned at the top 14 of the cabinet 10 to provide air flow between the inside and the outside of the cabinet 10. FIG. 7 shows two exhaust fans positioned at the top 14 of the cabinet 10. The at least one fan 32 is preferably a low-noise fan controlled by a temperature inside the cabinet 10. For example, the at least one fan 32 can be activated when the temperature inside the cabinet exceeds a temperature threshold. The at least one fan 32 can also be configured to run as long as power is supplied to at least one electronic device (e.g., tablet) inside the cabinet 10.

Figure 8:
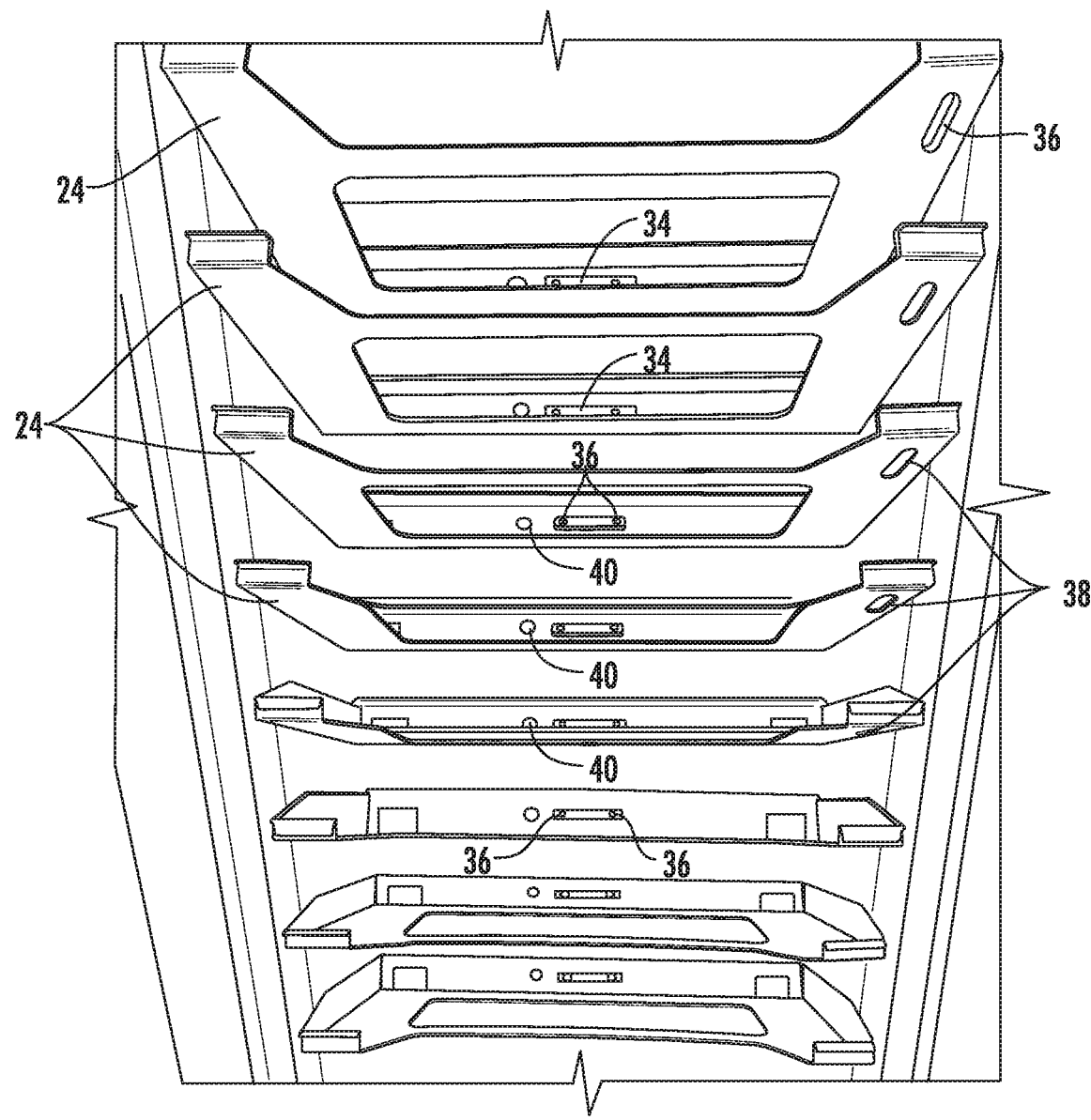
FIG. 8 is front view of a plurality of charging compartments inside a charging cabinet, according to one embodiment of the present invention.

Referring to FIG. 8, each compartment 24 is equipped with a connector 34 (e.g., a spring loaded connector). Each connector 34 is located on the back fame of each compartment 24. Two alignment posts 36 are located on two sides of each connector 34 to ensure an electronic device (e.g., tablet) is plugged into the connector 34 between the two alignment posts 36. The alignment posts 36 ensures that a tablet cannot be plugged into the connector 34 if it is not placed in a correct orientation. As such, the two alignment posts 36 can also prevent an electronic device (e.g., a tablet) from contacting or damaging delicate charging pins of the connector 34.

Each partition panel 22 is tilted downward at an angle (e.g., 30 degrees) toward the back wall 20 to guide an electronic device onto the respective connector 34 (e.g., a spring loaded connector) in each compartment 24, and ensure complete engagement with a connector 34 in the respective compartment. Angled panels will enable gravity to slide down a tablet and engage with respective connectors 34.

Each partition panel 22 is also designed to have an opening 38 to allow a charging light of an electronic device to be visible from outside the cabinet 10 via the transparent portion of the door 26—allowing a quick visual check to determine the presence or absence of electronic devices and/or charging status of electronic devices within the cabinet 10 while leaving the door 26 securely locked.

Figure 9:
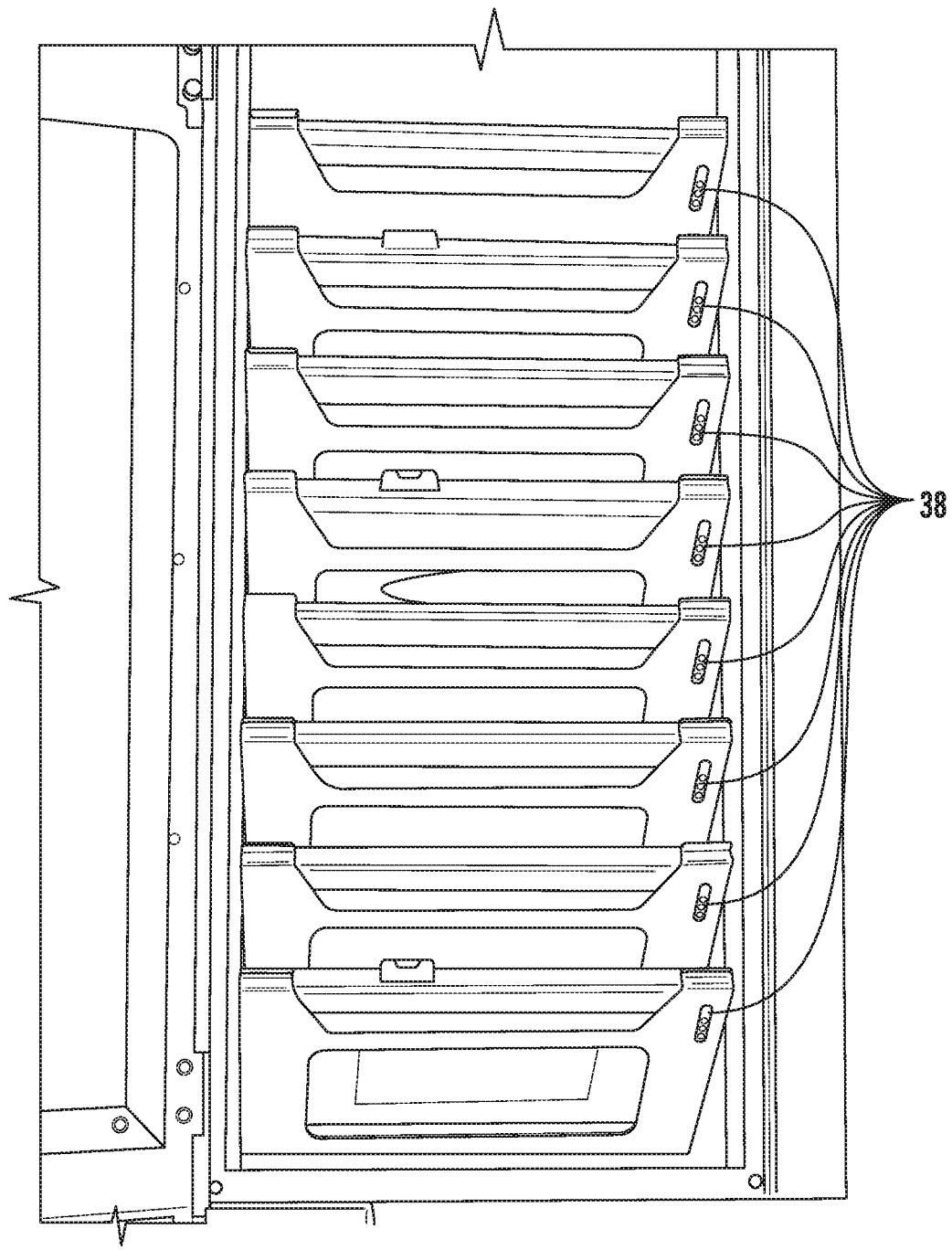
FIG. 9 is another front view of a plurality of charging compartments inside a charging cabinet, according to another embodiment of the present invention.

Referring to FIG. 9, a plurality of tablets are being charged and their front LED indicators are illuminated to indicate the charging status of the respective tablets. These LEDs can be viewed through the opening 38 on the partition panel 22 with the front door 26 open or closed to monitor the charging status of each tablet.

Still referring to FIG. 8, a verification switch 40 is located on a back frame 16 of each compartment 24 and is configured to activate power supply only when an electronic device (e.g., tablet) is fully secured to its connector 34. Preferably, the power supply is activated after a connection between an electronic device and a respective connector is established for a prescribed amount of time. This allows the cabinet 10 to safely provide power to a charging port only when an electronic device is securely installed. Similarly, power supply is configured to be deactivated when no connection is detected between an electronic device and at least one connector 34.

Figure 10:
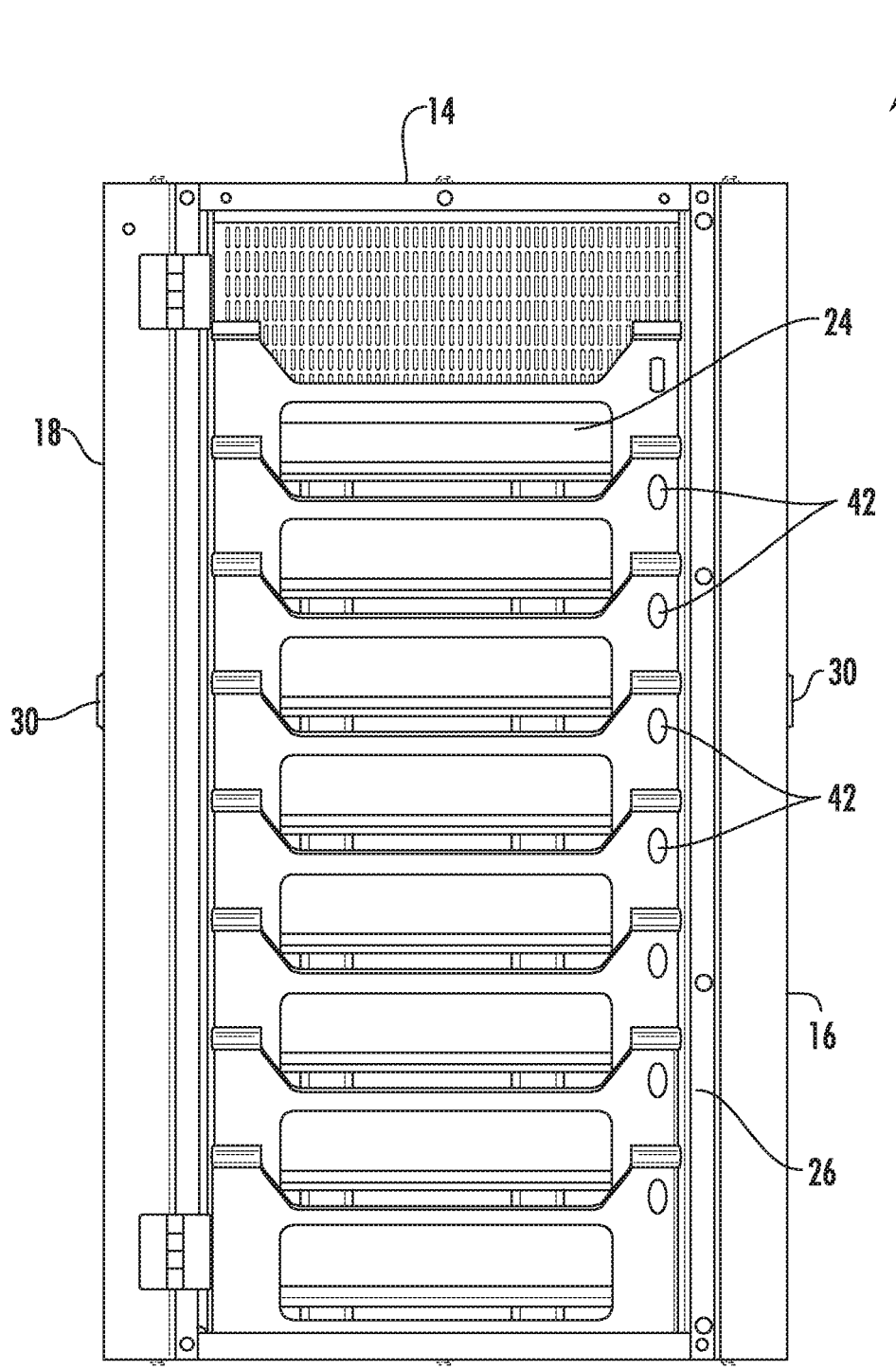
FIG. 10 is another front view of a charging cabinet, according to another embodiment of the present invention.

Referring to FIG. 10, according to another embodiment of the present invention, each partition panel 22 is equipped with charging status indicators (e.g., LED light) 42 to indicate charging status of a respective electronic device in the respective charging compartment 24. The charging status indicator 42 on the partition panels 22 can be used to show charging status of electronic devices that do not have their own charging indicators. The charging status indicators 42 measure charging current via respective connectors 34 and thereby calculating charging rate of an electronic device being charged. A specific color is used to distinguish different charging status. For example, a green LED light will turn on when the electronic device battery is charged to at least 80% of its full capacity, and a red LED light will turn on when the electronic device battery is charged below 80% of its full capacity.

Figure 11:
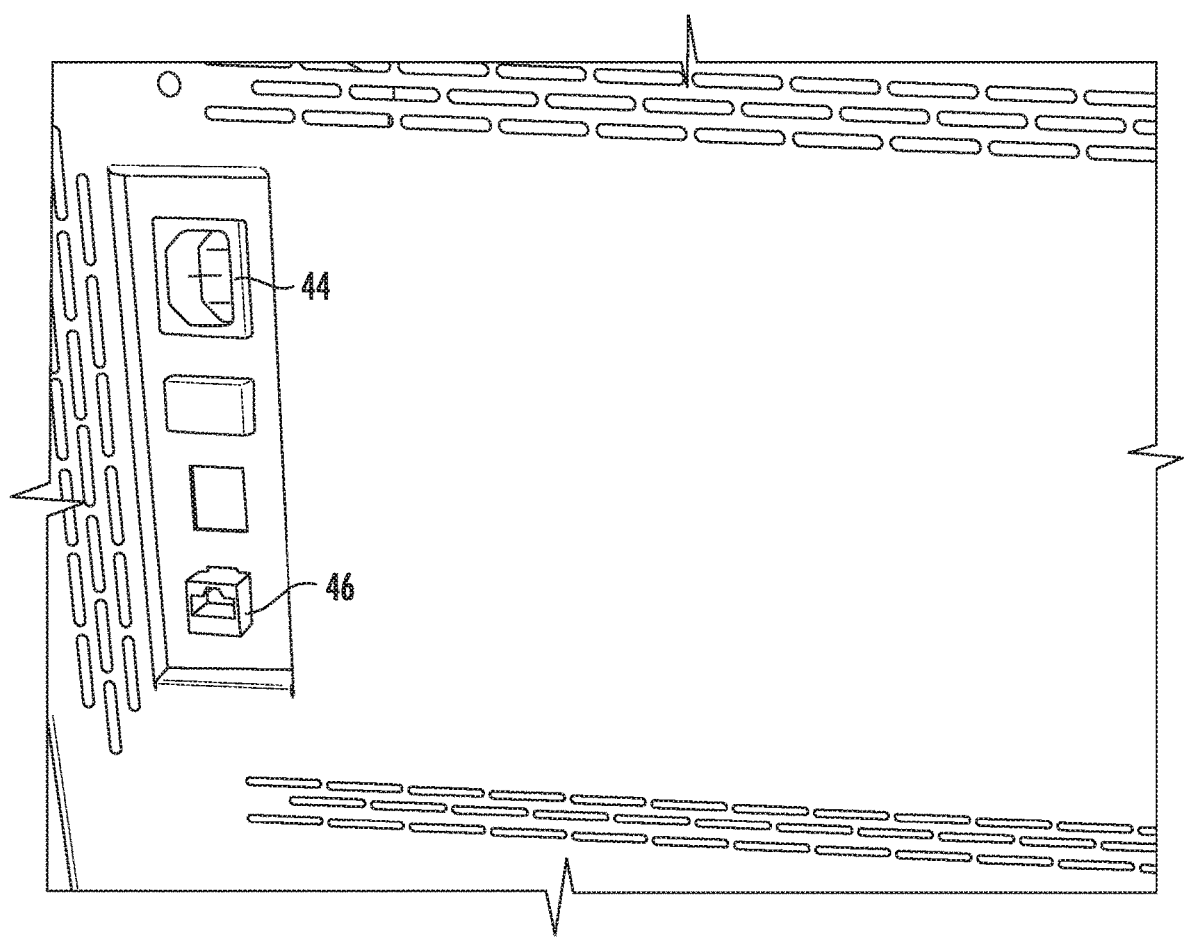
FIG. 11 is a partial back view of a charging cabinet, according to one embodiment of the present invention.
Figure 12:
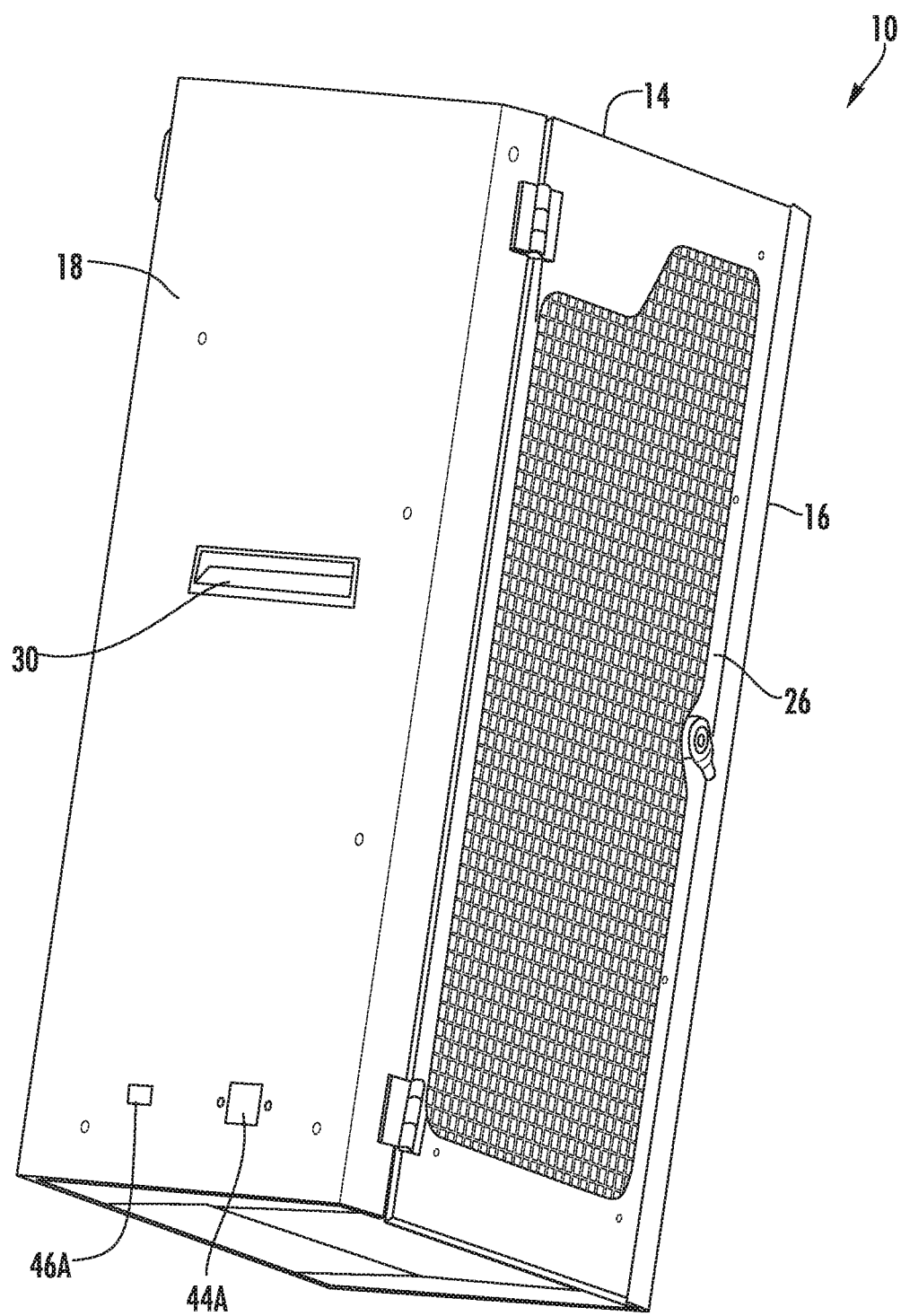
FIG. 12 is a side bottom prospective view of a charging cabinet, according to another embodiment of the present invention.

Referring to FIG. 11, each connector 34 is prewired to a primary power supply receptacle (e.g., a power supply receptacle 44) for charging a respective electronic device (e.g., tablet) and to a primary network connection (e.g., a network switch) for providing a network connection to each electronic device when stored in the cabinet 10. The power supply connection (e.g., power supply receptacle 44) is electrically connectable to an external power source. A network connection can be established via a cable connection such as a RJ45 connector 46 located on the side wall or back wall of the cabinet 10. The cabinet 10 can also include a secondary power supply receptacle 44A and a secondary network connector 46A, as shown in FIGS. 7 and 12, to back up the primary power supply receptacle 44 and network receptacle 46. The network connection connects a plurality of electronic devices (e.g., tablets) inside the charging cabinet 10 to a network such as the Internet and/or a Local Area Network. The primary and secondary network connection 46 and 46A are useful for providing software updates to the electronic devices, uploading data to the electronic devices, downloading data from the electronic devices, and/or backing up data from the electronic devices (e.g., tablets) when they are not in use, as well as tracking tablet removals and returns from the cabinet 10. The secondary power supply receptacle 44A and a secondary network connector 46A are shown to be on a side of the cabinet 10. However, they can be located to other places of the cabinet 10.

Figure 13:
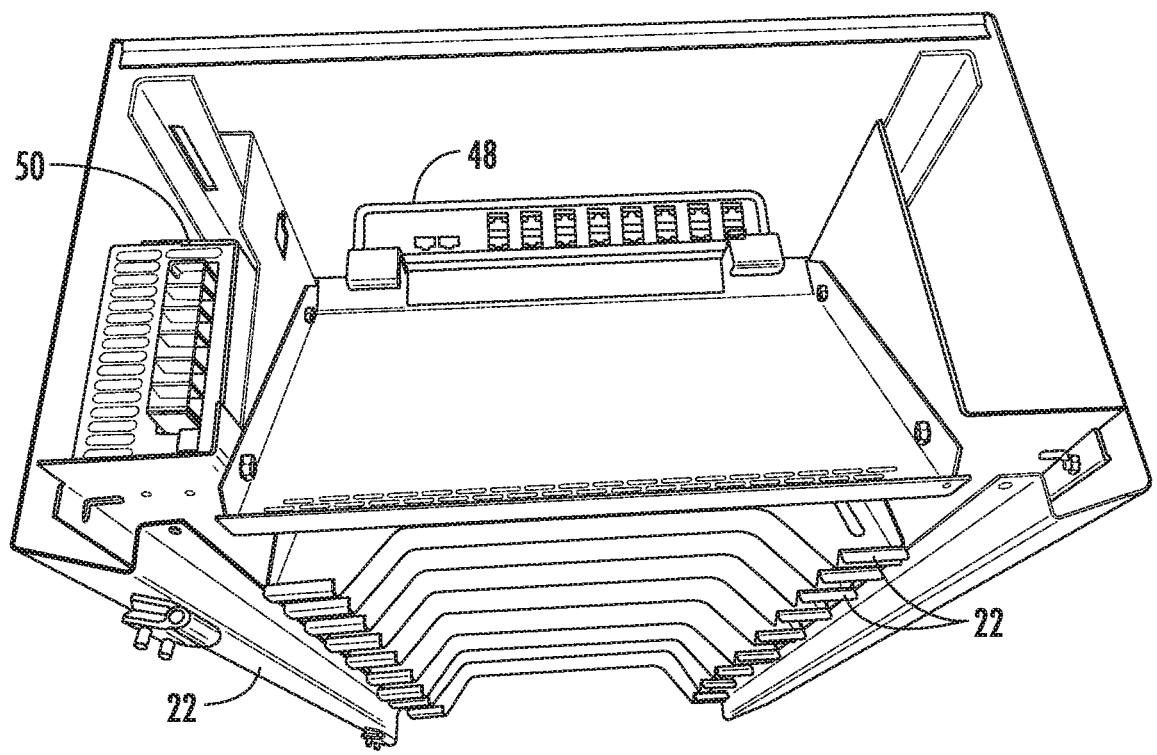
FIG. 13 is a top front view of a charging cabinet, according to another embodiment of the present invention.

Referring to FIG. 13, an optional network switch 48 and associated network switch power supply 50 are positioned on a top compartment of the cabinet 10 to provide network connection to the connectors 34 in each compartment 24. In the depicted embodiment, the network switch 48 is mounted behind a top partition panel 22 and secured by brackets, studs, nuts and other fasteners. The network switch 48 and network switch power supply 50 can each have its own light indicators when they are working.

Figure 14:
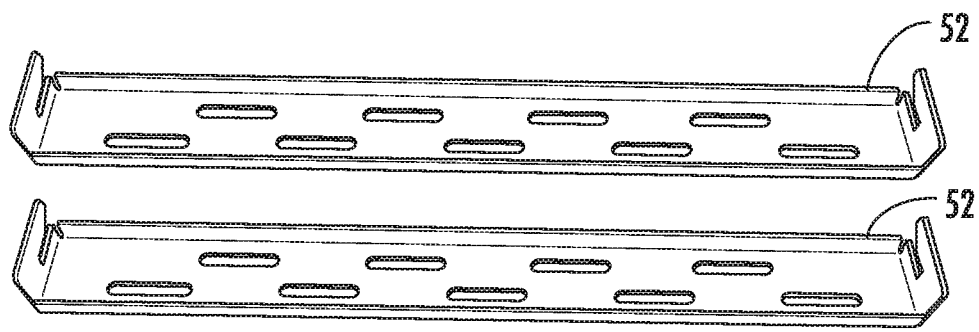
FIG. 14 is a top view of mounting brackets for holding the cabinet of FIG. 1 on a wall.

The cabinet 10 can be attached to a wall using one or more mounting brackets 52, as shown in FIG. 14. In the depicted embodiment, two mounting brackets 52 can be mounted to a support wall, enabling the cabinet 10 to hang on the protruding hooks of the mounting brackets 52. When the bracket 52 is mounted on the wall, the vertical spacing between the two brackets can be made to match the spacing between the cabinet's mounting slots on the back frame 16 of cabinet 10.

The cabinet 10 can be shipped prewired. Once the cabinet 10 is set up, the external RJ45 Local Area Network cable connector 46 or 46A and an external 120 VAC power supply connector 44 or 44A, as shown in FIGS. 11 and 12, can be plugged in. After a predetermined amount of time (e.g., 3 to 5 seconds) of applying power, at least one fan 32 (e.g., an internal power supply fan, a top cabinet exhaust fan) can start to remove heat from the cabinet 10.

The cabinet 10 can save time and lower cable/connector failure rates because the angled compartment panels enable gravity-assisted connection. Moreover, a user does not need to touch connectors or cables when use the cabinet 10 to charge and uncharge electronic devices.

The cabinet 10 is preferably made of metal (e.g., steel, aluminum, etc.) and/or polymer material (e.g., Acrylonitrile Butadiene Styrene plastic) having high strength to weight ratio. The cabinet can be painted to a desired color as needed.

Figure 15:
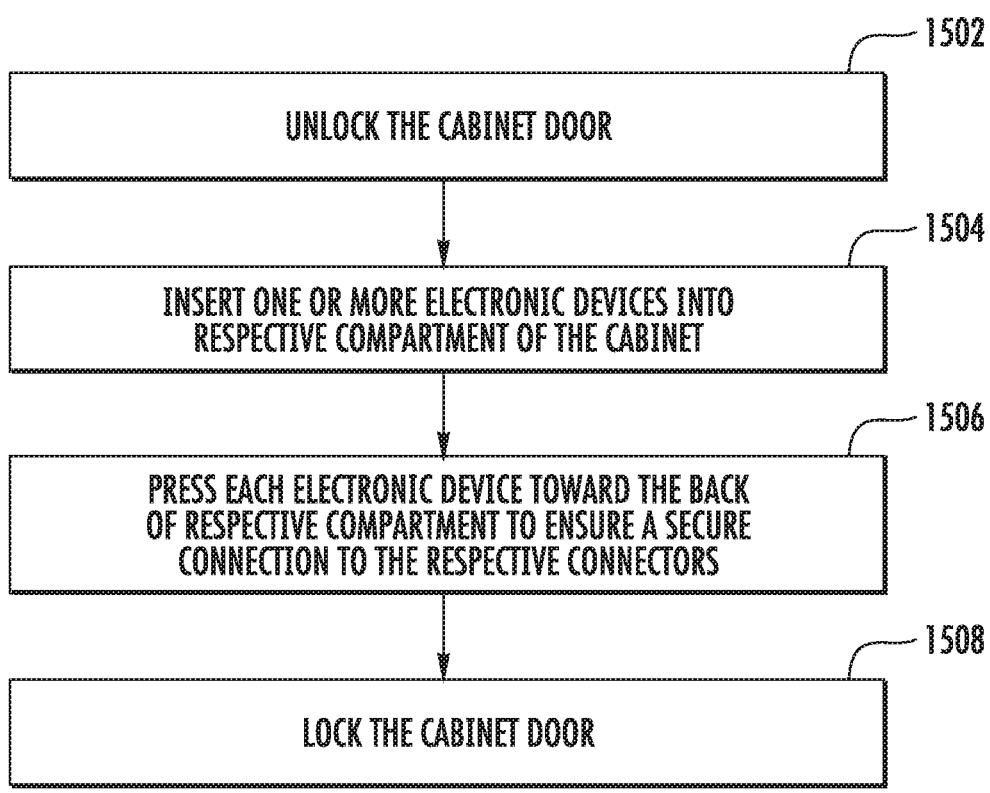
FIG. 15 is a flowchart of an example method of charging a plurality of electronic devices using a charging cabinet.

Referring to FIG. 15, a method of using cabinet 10 to charge one or more electronic devices includes, at step 1502, unlocking the cabinet door 26 using a key or a similar unlocking device such as a radio-frequency identification (RFID) badge, a smart phone with short range wireless connection (e.g., Bluetooth) function, and the like.

At step 1504, one or more electronic devices can be inserted into respective compartments 24. For example, one or more tablets (not shown) can be inserted into respective compartments with screen-side down.

At step 1506, each electronic device is pressed toward the back of the compartment 24 to ensure a good connection with a respective connector 32 in the respective compartments 24. The secure connection can be facilitated by respective alignment posts 36 and verification switch 40. Power supply is turned on when a connection is detected between at least one electronic device and a respective connector.

At step 1508, when the one or more electronic devices (e.g., tablets) is being charged, the cabinet door 26 can be locked. The charging indicators of the respective electronic devices (e.g., tablets) will illuminate to indicate the charging status of the respective electronic devices. These LEDs can be viewed through the opening 38 on the partition panel 22, as shown in FIG. 9. Alternatively, the charging status of the one or more electronic devices can be viewed on the respective charging status indicator 42 integrated on the partition panels 22, as shown in FIG. 10. The charging status can be monitored with the front door 26 open or closed.

The foregoing is provided for illustrative and exemplary purposes; the present invention is not necessarily limited thereto. Rather, those skilled in the art will appreciate that various modifications, as well as adaptations to particular circumstances, are possible within the scope of the invention as herein shown and described and of the claims appended hereto.

What is claimed is:

1. A tablet charging cabinet comprising:
a storage space including a base, a top wall, two opposed side walls, and a back wall; and
a plurality of angled partition panels defining a plurality of storage and charging compartments at different elevations therein, each compartment having a respective connector at the back of the respective panel;
wherein each connector is operable to provide power supply and network connection to a respective electronic device when connected thereto;
wherein each partition panel includes at least one of:
a charging status indicator mounted on each of the plurality of partition panels and operable to illuminate when the respective electronic device is charging in the respective compartment; and
an opening through which a charging indicator light of the respective electronic device is visible from outside the cabinet when the respective electronic device is charging in the respective compartment; and
wherein the plurality of partition panels are angled downward toward the back wall.

2. The charging cabinet of claim 1, further comprising a door covering the storage space of the cabinet.

3. The charging cabinet of claim 2, wherein the door includes at least a section made of a transparent material through which the at least one of the charging status indicator or the opening of each partition panel is visible when the door is closed.

4. The charging cabinet of claim 2, wherein the door includes at least a section made of mesh material that allows air flow between the charging cabinet and surrounding environment.

5. The charging cabinet of claim 2, wherein the door is lockable and openable using at least one of: a mechanical key; a radio-frequency identification (RFID) badge; and a smart device with a short range wireless connection function.

6. The charging cabinet of claim 1, wherein the cabinet further includes a pull-out drawer at a bottom of the cabinet.

7. The charging cabinet of claim 1, further comprising at least one fan mounted inside the storage space.

8. The charging cabinet of claim 7, wherein the at least one fan is activated by a temperature inside the storage space.

9. The charging cabinet of claim 7, wherein the at least one fan is activated by at least one connection between a connector and a respective electronic device inside the cabinet.

10. The charging cabinet of claim 1, further comprising a verification switch on a back frame of each compartment, wherein the verification switch is operable to detect connection of an electronic device to a connector in the respective compartment.

11. The charging cabinet of claim 10, wherein the power supply is activated when a connection is detected between an electronic device and a respective connector via the verification switches.

12. The charging cabinet of claim 11, wherein the power supply is activated after the connection is detected for a prescribed amount of time.

13. The charging cabinet of claim 12, wherein the power supply is deactivated when no connection is detected between at least one electronic device and a respective connector via the verification switches.

14. A method of charging one or more electronic devices in a charging cabinet, the charging cabinet having a storage space including a base, a top wall, two opposed side walls, a back wall, and a plurality of angled partition panels defining a plurality of storage and charging compartments at different elevations therein, each compartment having a respective connector at the back of the respective panels, an alignment mechanism being located on two sides of each connector to facilitate alignment of an electronic device to a respective connector, and wherein each connector is operable to provide power supply and network connection to a respective electronic device connected thereto, and wherein each partition panel has an opening to allowing a charging indicator light of an electronic device to be visible from outside the cabinet, and wherein the plurality of partition panels are angled downward toward the back wall, the method comprising:
- unlocking the cabinet door;
- inserting one or more electronic devices into one or more of the respective compartments of the cabinet;
- pressing each electronic device toward the back of respective compartment to ensure a secure connection to the respective connectors; and
- locking the cabinet door.

15. The method of claim 14, further comprising monitoring charging status of the one or more electronic devices from outside the charging cabinet.

\* \* \* \* \*